United States Patent
Reynolds et al.

(10) Patent No.: US 8,360,411 B2
(45) Date of Patent: Jan. 29, 2013

(54) APPARATUS FOR MANUFACTURE OF PV SOLAR CELLS OR THIN FILM SOLAR MODULES

(75) Inventors: Reese Reynolds, Sonora, CA (US); Wail George Mansour, Oakdale, CA (US); Mark Dipietro, Boulder Creek, CA (US); Chetwyn Jones, Washington, DC (US)

(73) Assignee: MRL Industries, Inc., Sonora, CA (US)

( * ) Notice: Subject to any disclaimer, the term of this patent is extended or adjusted under 35 U.S.C. 154(b) by 273 days.

(21) Appl. No.: 12/711,595

(22) Filed: Feb. 24, 2010

(65) Prior Publication Data
US 2011/0018187 A1    Jan. 27, 2011

Related U.S. Application Data

(60) Provisional application No. 61/155,944, filed on Feb. 27, 2009.

(51) Int. Cl.
*B23Q 3/00* (2006.01)

(52) U.S. Cl. .......... 269/305; 269/309; 269/55; 198/850; 59/1

(58) Field of Classification Search .................. 269/303, 269/305, 289 MR, 309, 310, 55; 29/281.1; 59/85, 900, 35.1; 198/850–853
See application file for complete search history.

(56) References Cited

U.S. PATENT DOCUMENTS

| | | | |
|---|---|---|---|
| 2,365,866 A | | 12/1944 | Dalrymple |
| 3,066,549 A | | 12/1962 | Benjamin |
| 3,160,024 A | | 12/1964 | Mojonnier |
| 3,550,755 A | | 12/1970 | Noren |
| 4,307,681 A | | 12/1981 | Lampkin et al. |
| 4,815,270 A | * | 3/1989 | Lapeyre ........................... 59/84 |
| 6,161,749 A | * | 12/2000 | Bastacky et al. ............. 228/49.5 |
| 6,732,856 B2 | | 5/2004 | Maine, Jr. |
| 7,410,225 B1 | * | 8/2008 | Marzetta et al. .............. 305/188 |
| 2002/0158396 A1 | * | 10/2002 | Bennett et al. ................ 269/309 |

OTHER PUBLICATIONS

Written Opinion for Singapore Patent Application No. 201106194-2, dated Sep. 11, 2012.

* cited by examiner

*Primary Examiner* — Robert Canfield
*Assistant Examiner* — Brent W Herring
(74) *Attorney, Agent, or Firm* — Morgan, Lewis & Bockius LLP

(57) ABSTRACT

The present invention relates to equipment used to manufacture PV cells or modules. In some embodiments, a support structure is provided that provides support for substrates used in the manufacture of PV cells or modules. The support structure provides support for the substrate at the edge, allows access to the rear of the substrate and is composed of materials that do not contaminate the substrate during processing.

11 Claims, 10 Drawing Sheets

APPARATUS FOR MANUFACTURE OF PV SOLAR CELLS OR THIN FILM SOLAR MODULES

CROSS REFERENCE TO PRIOR APPLICATION

This application claims priority to U.S. Provisional Application No. 61/155,944 filed Feb. 27, 2009, which is incorporated by reference herein.

FIELD OF INVENTION

This invention relates generally to the field of equipment used in the manufacture of photovoltaic (PV) solar cells or thin film (TF) modules. In one embodiment, the present invention relates to the support of solar cell or TF module substrates as they are transported through an in-line processing apparatus.

BACKGROUND OF THE INVENTION

Solar energy is widely accepted as being an excellent source of renewable energy. Photovoltaic (PV) cells which can convert sunlight into electricity have been studied for the past ~70 years. The adoption and wide spread use of PV cells has been slow because they have exhibited poor conversion efficiency and have been expensive to manufacture. Therefore, the economics ($/Watt) of using PV cells to generate electricity have not been competitive with traditional sources such as coal, oil, natural gas, etc. The $/Watt metric represents the total system cost to generate a Watt of energy. Lower PV solar cell efficiencies and higher PV solar cell system costs increase this metric and lowers the competitiveness of the PV solar cell system relative to traditional energy generation systems.

Recent advances in the design and manufacture have improved the efficiency of the PV solar cells and lowered the manufacturing cost such that PV based solar energy systems have improved economics. It is a goal that PV based solar energy systems will be able to generate electricity at costs that are competitive with traditional electricity generation methods in the near future. For this goal to be realized, advances must be made to continue to improve the conversion efficiency of the PV solar cells and to lower the manufacturing costs.

In the manufacture of PV solar cells or TF modules, substrates are often processed in equipment configured in an "in-line" structure. That is, the substrates move through the equipment in a continuous manner or in small steps. The input portion of the equipment is positioned at one end of the system and the output portion is positioned at the opposite end. This type of equipment is to be distinguished from "batch" systems wherein the substrates are generally processed in large batches and the input and output portions of the equipment are generally found at the same end of the system. In the in-line equipment, an automation system is used to translate the substrates from the input end to the output end. The automation system may comprise a conveyor, a belt, discrete pallets, rollers, a "walking beam" system, chains, strings, or cables, among others.

Current in-line equipment for the manufacture of PV based solar cells or TF modules suffer from a number of problems. Examples of these problems may be high equipment cost, low throughput, large footprint, poor performance, contamination of the substrate by the automation system, shadowing of the backside of the substrate by the automation system, movement of the substrate during processing, and others. These problems may act individually or in combination to lower the efficiency of the PV solar cells or TF modules or increase the cost of manufacturing the PV solar cells or TF modules. This will increase the $/Watt economic metric used to evaluate energy system performance and slow the adoption of PV solar energy systems. Therefore, there is a need for automation systems to be used in in-line equipment used to manufacture PV solar cells or TF modules that address these problems.

SUMMARY OF THE INVENTION

Accordingly and advantageously, some embodiments of the present invention provide a support system for solar cell or TF module substrates as they are transported through an in-line processing apparatus. The support system captures the substrate and supports the substrate around the edge. The support system allows exposure of the backside of the substrate so that there is no shadowing effect. Furthermore, the support system is manufactured from materials chosen so that the PV cell or TF module substrate is not contaminated during processing. The support system is suitable for use with equipment configured in an in-line structure used to manufacture PV cells or TF modules.

These and other advantages are achieved in accordance with the present invention as described in detail below.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not to scale.

The techniques of the present invention can readily be understood by considering the following detailed description in conjunction with the accompanying drawings, in which.

DETAILED DESCRIPTION OF THE INVENTION

After considering the following description, those skilled in the art will clearly realize that the teachings of the invention can be readily utilized in the manufacture of PV solar cells or TF modules.

One configuration of PV solar energy systems comprises PV solar modules. One version of PV solar modules may be constructed of a plurality of PV solar cells connected in series or parallel. The PV solar cells may be based on single crystal semiconductor substrates or on polycrystalline semiconductor substrates. Examples of suitable semiconductor substrates comprise Si, poly-Si, and GaAs, among others. For economy of language within the current disclosure, the phrase "PV solar cell" will be understood to mean the semiconductor substrates used in the manufacture of a PV solar module.

A second version of PV solar modules may be constructed by applying thin films of semiconductor materials on rigid substrates. Examples of semiconductor thin films comprise a-Si, CdTe, CIGS (Cu—In—Ga—S; or Cu—In—Ga—Se), and organic semiconductor materials, among others. An example of a typical rigid substrate is a glass sheet. For economy of language within the current disclosure, the phrase "TF module" will be understood to mean the formation of the PV solar module by the application of thin films of semiconductor materials onto a rigid substrate.

In-line equipment is often used for the manufacture of PV solar cells or TF modules. In the case of PV solar cells, the in-line equipment may be used to process a plurality of PV solar cells by making the equipment wide enough to transport the PV solar cells through the equipment in one or more lanes through the equipment. Typical substrates used in the manufacture of PV solar cells comprise pseudo-square single crystal Si wafers, square poly-Si slices, rectangular poly-Si slices, and GaAs wafers; among others. Typical sizes of the substrates include 125 mm×125 mm, 156 mm×156 mm, 210 mm×210 mm and larger substrates are proposed for the future.

In the case of PV solar TF modules, the in-line equipment may be used to process a plurality of PV solar TF modules by making the equipment wide enough to transport the PV solar TF modules through the equipment in one or more lanes through the equipment. Typical substrates used in the manufacture of PV solar TF modules comprise square rigid substrates (such as glass), and rectangular rigid substrates (such as glass), among others.

Figure 1:
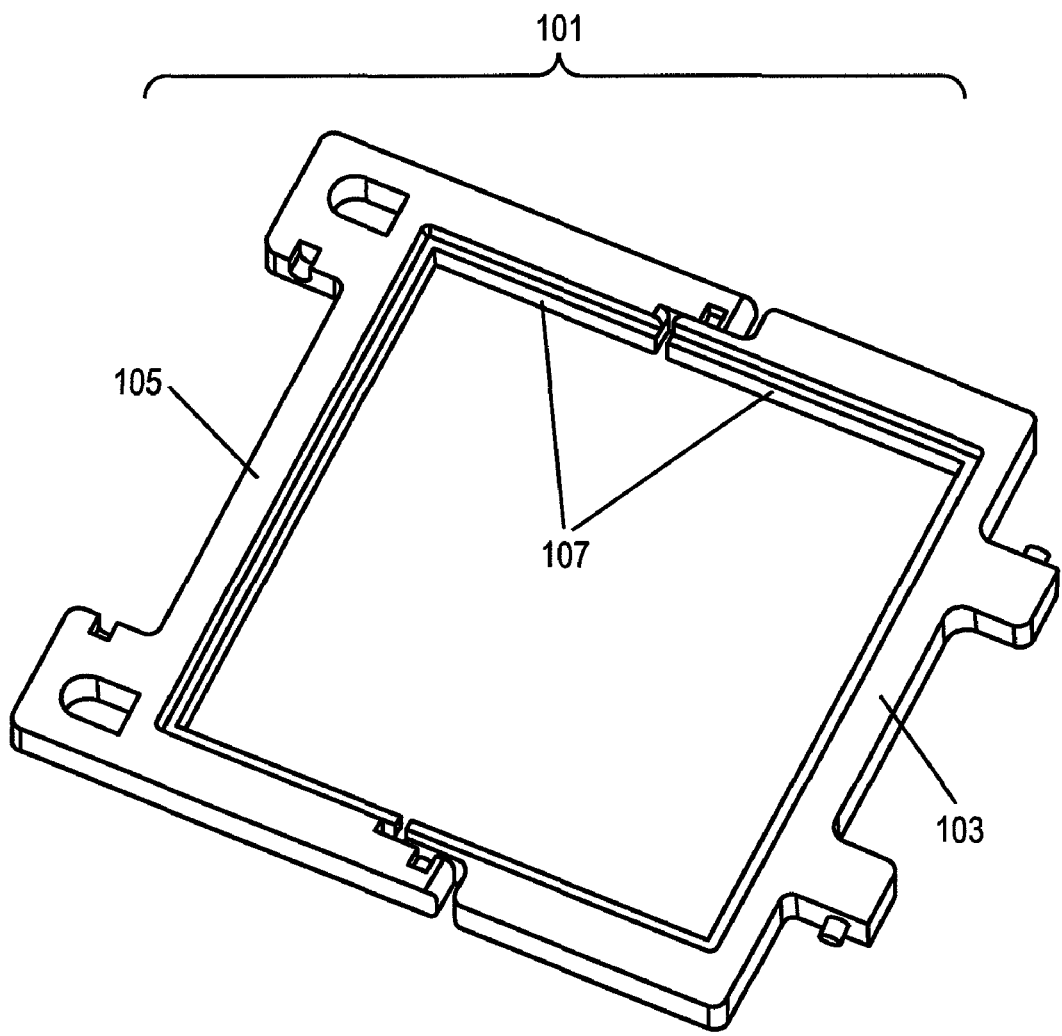
FIG. 1 is a schematic illustration of one link of the substrate support system according to one embodiment of the present invention.

FIG. 1 is a schematic illustration of one link 101 of the substrate support system according to one embodiment of the present invention. The link 101 is comprised of sub-components 103, and 105 which are assembled to form the link and to give the link flexibility. The substrate (not shown) would be held on the ledge 107. Each sub-component 103, 105 incorporates a ledge 107 that combine when assembled into a link to capture the substrate. Traditional in-line equipment may use a wire mesh belt as an automation system for conveying the substrates through the system. Since the wire mesh belt does not actively capture the substrate, the substrates may move from their initial configuration during the processing sequence due to mechanical vibration and the influence of gas movements within the system. This is particularly prevalent for very thin substrates.

Figure 2:
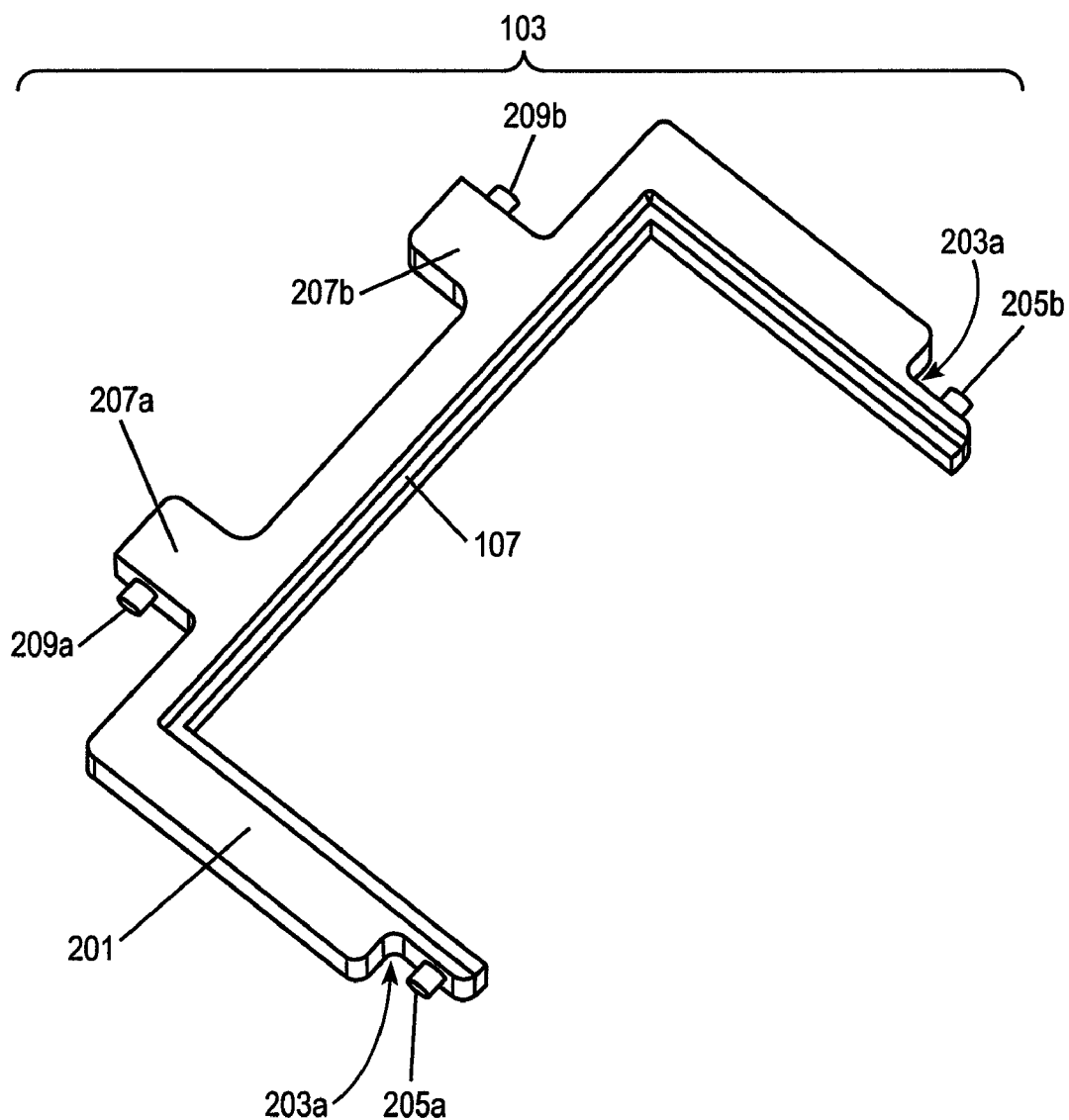
FIG. 2 is a schematic illustration of one of the sub-components of one link of the substrate support system according to one embodiment of the present invention.

FIG. 2 is a schematic illustration of one of the sub-components 103 that combine to form link 101. Sub-component 103 has a top surface 201. Ledge 107 is formed within the top surface 201 to form a support for the substrate (not shown) within the interior of sub-component 103. Ledge 107 may be flat or may comprise raised areas (not shown) to elevate the substrate slightly above the ledge. Typical examples of raised areas comprise bumps, tabs, mesas, and pyramids, among others. The raised areas serve to thermally isolate the substrate from ledge 107 so that the substrate may be uniformly heated without conduction losses from the substrate into ledge 107.

Sub-component 103 further comprises notches 203a and 203b. The notches are formed at the end of sub-component 103 that will be at the center of link 101. The notches are formed on the exterior of the sub-component. The notches further comprise pins 205a and 205b. Pins 205a and 205b are elliptical in shape and comprise a major axis and a minor axis. The width of the elliptical shape along the major axis is greater than the width of the elliptical shape along the minor axis. The pins face toward the exterior of the sub-component. The major axis of the elliptical shape is aligned within the plane of sub-component 103.

Sub-component 103 further comprises tabs 207a and 207b. The tabs are formed at the end of sub-component 103 that will be away from the center of link 101 and toward the neighboring link (not shown). The tabs are formed on the exterior of the sub-component. The tabs further comprise pins 209a and 209b. The pins face toward the exterior of the sub-component. Pins 209a and 209b are elliptical in shape and comprise a major axis and a minor axis. The width of the elliptical shape along the major axis is greater than the width of the elliptical shape along the minor axis. The pins face toward the exterior of the sub-component. The major axis of the elliptical shape is aligned within the plane of sub-component 103.

Figure 3:
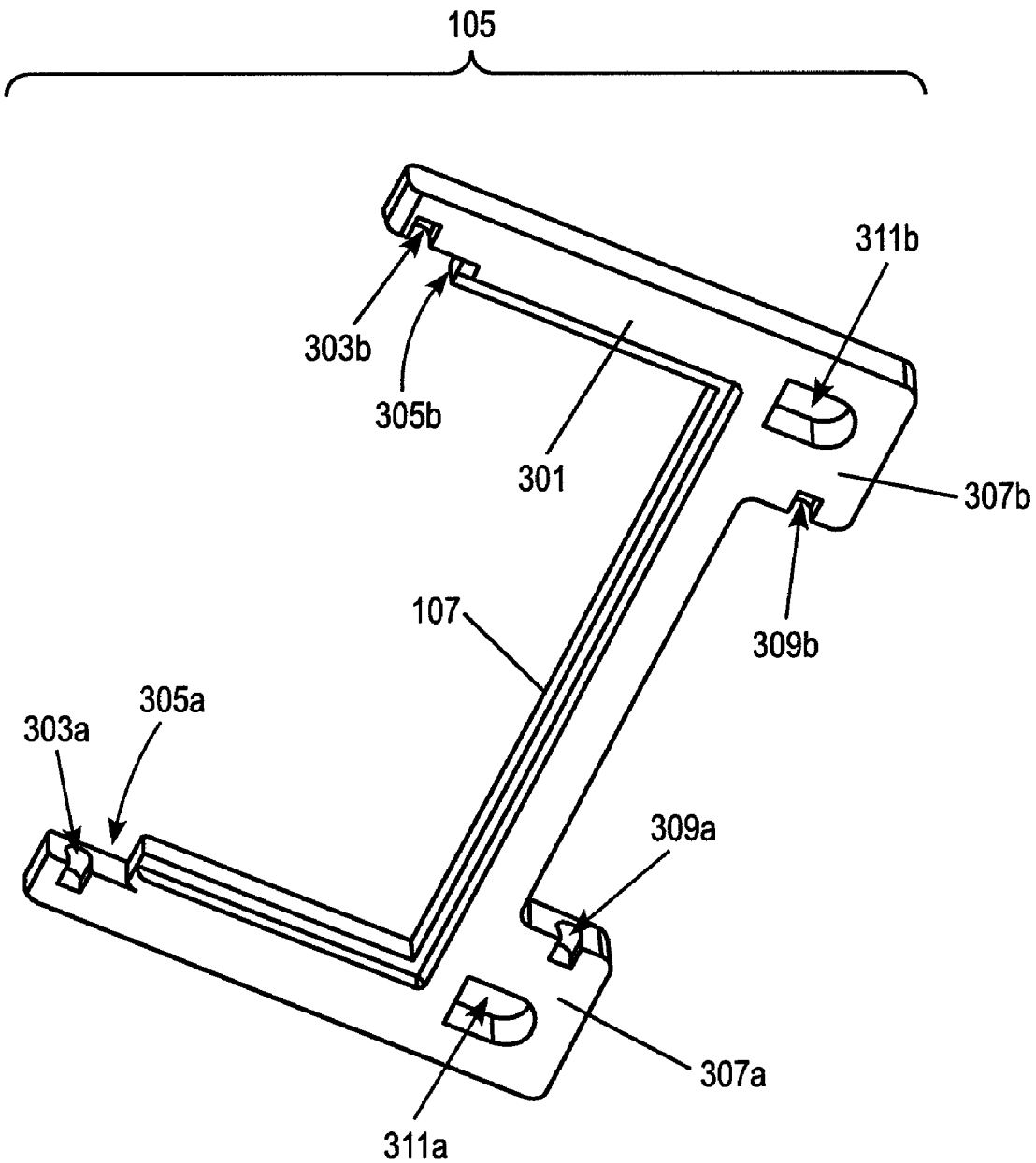
FIG. 3 is a schematic illustration of one of the sub-components of one link of the substrate support system according to one embodiment of the present invention.

FIG. 3 is a schematic illustration of one of the sub-components 105 that combine to form link 101. Sub-component 105 has a top surface 301. Ledge 107 is formed within the top surface 301 to form a support for the substrate (not shown) within the interior of sub-component 105. Ledge 107 may be flat or may comprise raised areas (not shown) to elevate the substrate slightly above the ledge. Typical examples of raised areas comprise bumps, tabs, mesas, and pyramids, among others. The raised areas serve to thermally isolate the substrate from ledge 107 so that the substrate may be uniformly heated without conduction losses from the substrate into ledge 107.

Sub-component 105 further comprises notches 305a and 305b. The notches are formed at the end of sub-component 105 that will be at the center of link 101. The notches are formed on the interior of the sub-component. The notches further comprise slots 303a and 303b. The slots face toward the interior of the sub-component.

Sub-component 105 further comprises tabs 307a and 307b. The tabs are formed at the end of sub-component 105 that will be away from the center of link 101 and toward the neighboring link (not shown). The tabs are formed on the exterior of the sub-component. The tabs further comprise slots 309a and 309b. The slots face toward the interior of the sub-component. The tabs further comprise holes 311a and 311b. The holes are used to interface with the drive system to be described later.

Sub-components 103 and 105 may be composed of materials that do not contaminate the substrate during processing. In some process sequences, the substrate may be protected by previously deposited materials and may undergo a simple thermal treatment. In this case, the sub-components 103 and 105 may be composed of metals or metal alloys. Typical metal materials may comprise nichrome doped with vanadium, steel alloys, and high temperature refractory metal alloys among others. In some process sequences, the substrate may not be protected by previously deposited materials or may be undergoing processing with a reactive species. In this case, it is important that the material used to form sub-components 103 and 105 not contaminate the substrate. Various ceramic materials such as AlN, BN, SiC, $Al_2O_3$, $ZrO_2$, and others are typical examples. These ceramics have high temperature stability and are relatively inert to much reactive chemistry.

Sub-components 103 and 105 may be formed by any well known manufacturing method. Typical examples include machining, stamping from metal sheet stock and bending, and casting, among others. Sub-components 103 and 105 are advantageously formed by a low cost manufacturing method such as casting.

Link 101 may be formed through the combination of sub-components 103 and 105. Sub-components 103 and 105 are aligned so that their top surfaces 201 and 301 are oriented in the same direction. Pins 203a and 203b of sub-component 103 engage with slots 303a and 303b of sub-component 105. The assembly forms a completed link 101 as illustrated in FIG. 1. The substrate (not shown) is held by ledge 107 as previously described. Multiple links may be combined to form a transport system.

Link 101 may be connected to a neighboring link through the interaction of the tabs 207a and 207b on sub-component 103 with the tabs 307a and 307b of a neighboring sub-component 105. The pins 209a and 209b of sub-component 103 engage with slots 309a and 309b of the neighboring sub-component 105. In this way, a transport system of any length may be formed by repeating this process. Therefore, the transport system is formed from combinations of only two pieces, specifically sub-components 103 and 105.

Figure 4:
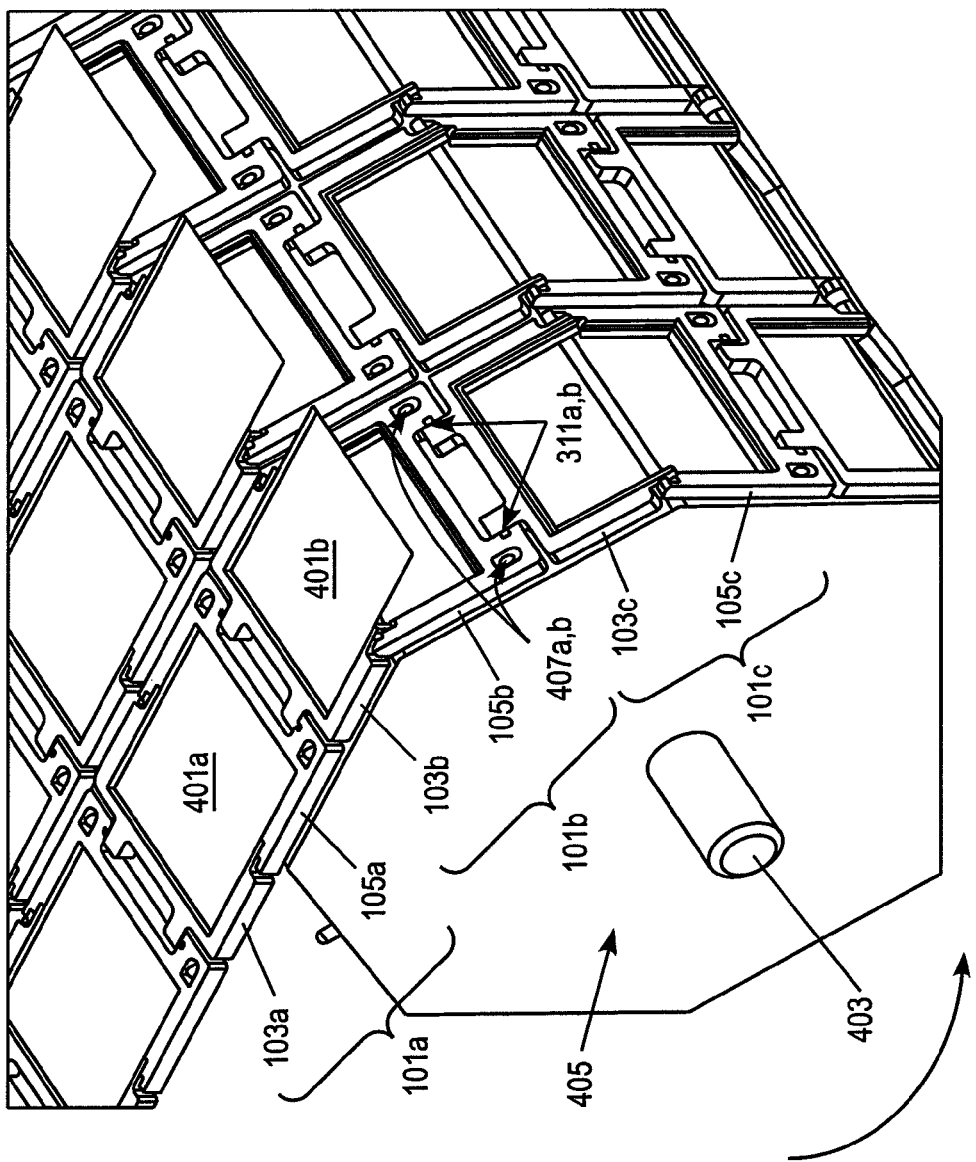
FIG. 4 is a schematic illustration of the substrate support system according to one embodiment of the present invention illustrating the capture/release of the substrate.

FIG. 4 is a schematic illustration of multiple lane (i.e. three) substrate transport system illustrating a plurality of links. Three neighboring links 101a, 101b, and 101c are shown with the corresponding sub-components 103a, 103b, 103c, and 105a, 105b, 105c. The links engage with drive member 405 where pins 407a, 407b on the drive member engage with the holes 311a, 311b within sub-component 105. Drive member 405 rotates around drive shaft 403. Drive member 405 advantageously has a polygonal cross-section with 30 degree angles such that in operation the links will bend to conform to the polygonal shape.

FIG. 4 has been drawn to illustrate the movement of substrates from right to left and illustrates the input portion of the system. As indicated by the arrow, if drive shaft 403 is rotating counterclockwise, then substrates 401 are being loaded into the links 101. Substrate 401b is placed into the pocket formed by ledge 107 of sub-component 103b by an automation system (not shown). As the drive member 405 continues to rotate, sub-component 105b rotates up to complete the pocket and capture substrate 401b within link 101b.

At the output portion of the system, (not shown) the wafer transfer sequence would be reversed. Sub-component 103a would flex downward to follow the contours of the output drive member. This would expose the leading edge of substrate 401a to the output automation system and the substrate would be extracted from ledge 107.

The transport system used for in-line tools is typically a closed loop belt. With the commonly used metal mesh belt assemblies, if the belt is damaged the entire belt must be replaced. This occurs at significant cost and most importantly significant lost production time for the manufacturer of the PV cells or TF modules. In some embodiments of the present invention, individual damaged links can be easily replaced. This is accomplished by reducing the tension or separation of the input and output drive members sufficiently to allow the upward bend of a link or sub-component of a link to 90 degrees. When the upward angle reaches 90 degrees the damaged link or sub-component may be removed and replaced with a new link or sub-component.

Figure 5:
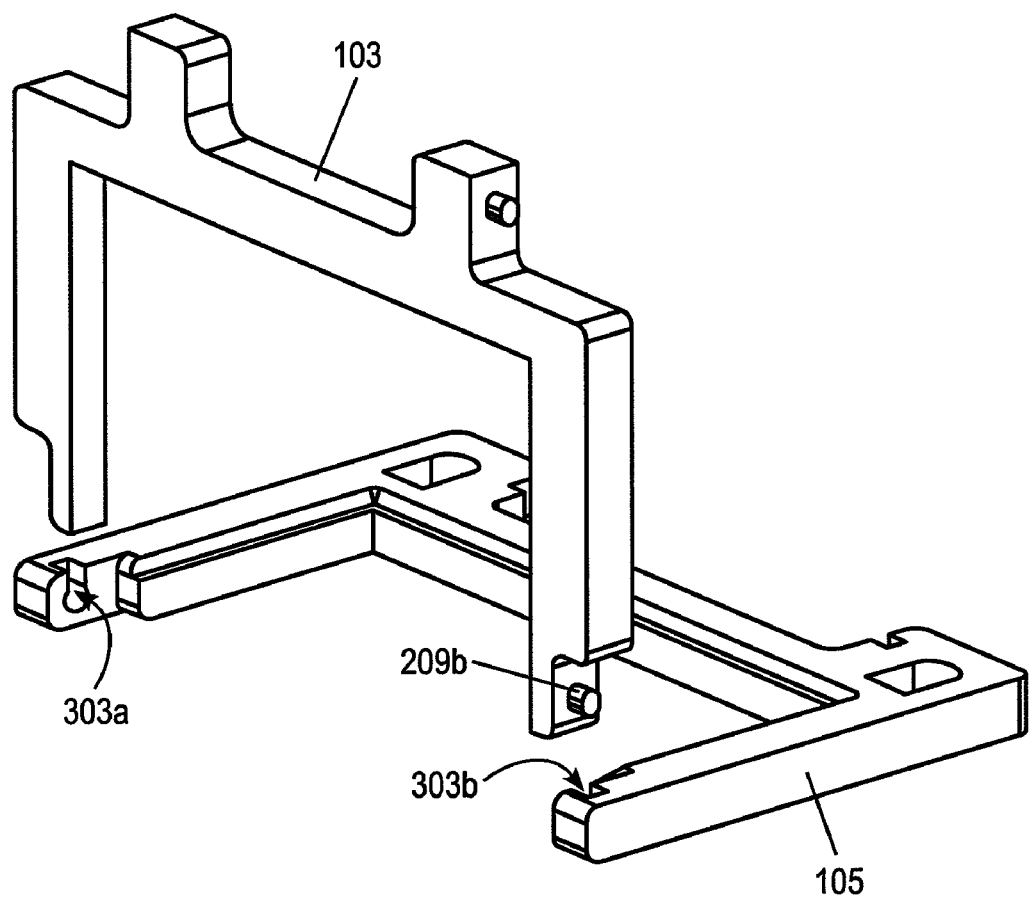
FIG. 5 is a schematic illustration of the substrate support system according to one embodiment of the present invention illustrating the capture/release of the sub-components.

FIG. 5 is a schematic illustration of the substrate support system illustrating the capture/release of the sub-components during the repair and replacement of a damaged link or sub-component.

Figure 6:
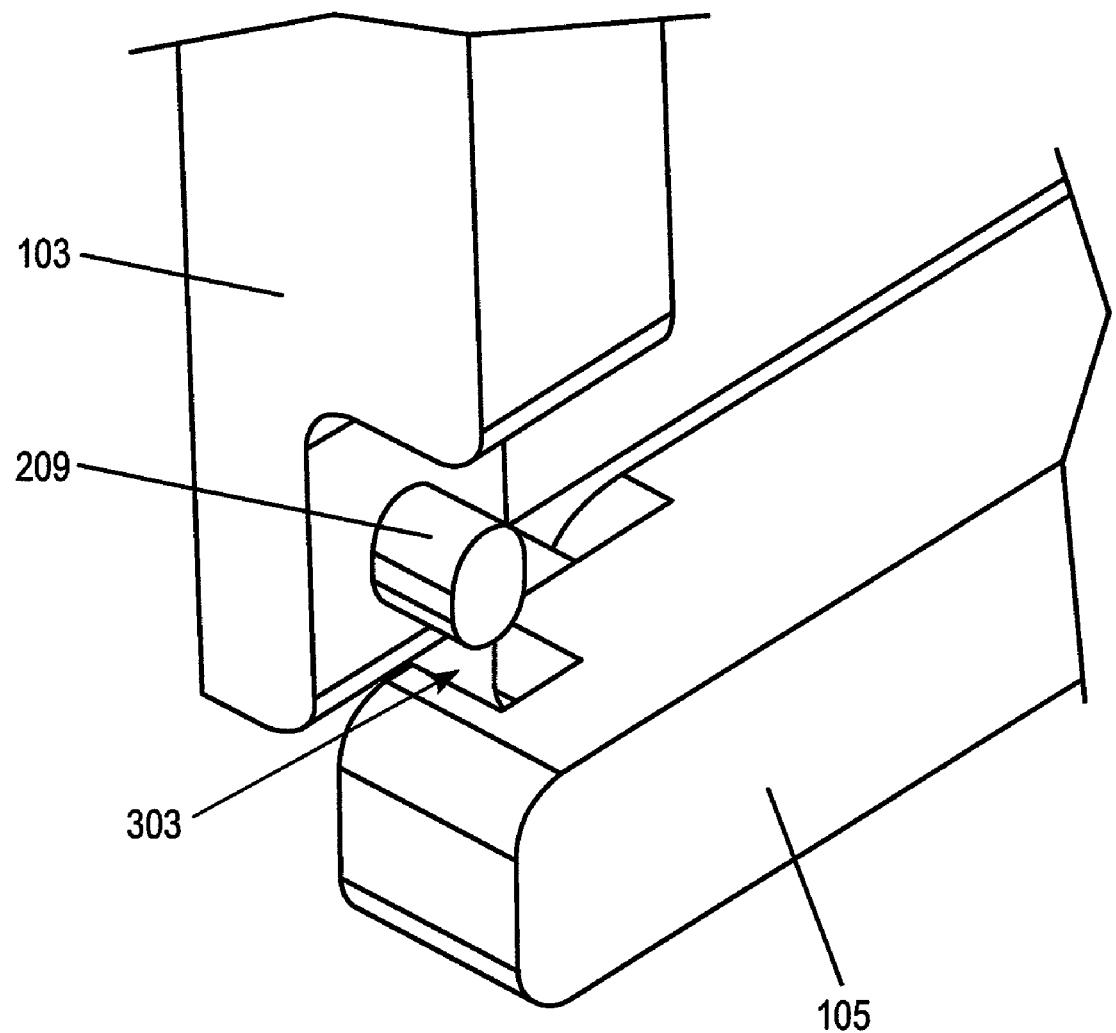
FIG. 6 is a schematic illustration of the substrate support system according to one embodiment of the present invention illustrating the capture/release of the sub-components.

FIG. 6 is a schematic illustration of the substrate support system illustrating the capture/release of the sub-components during the repair and replacement of a damaged link or sub-component showing a close-up of the pin 209 of sub-component 103 and the slot 303 of sub-component 105. When sub-component 103 is positioned at a 90 degree angle relative to sub-component 105, the major axis of the elliptically-shaped pin 209 is aligned with the slot 303 of sub-component 105. This allows pin 209 to enter slot 303.

Figure 7:
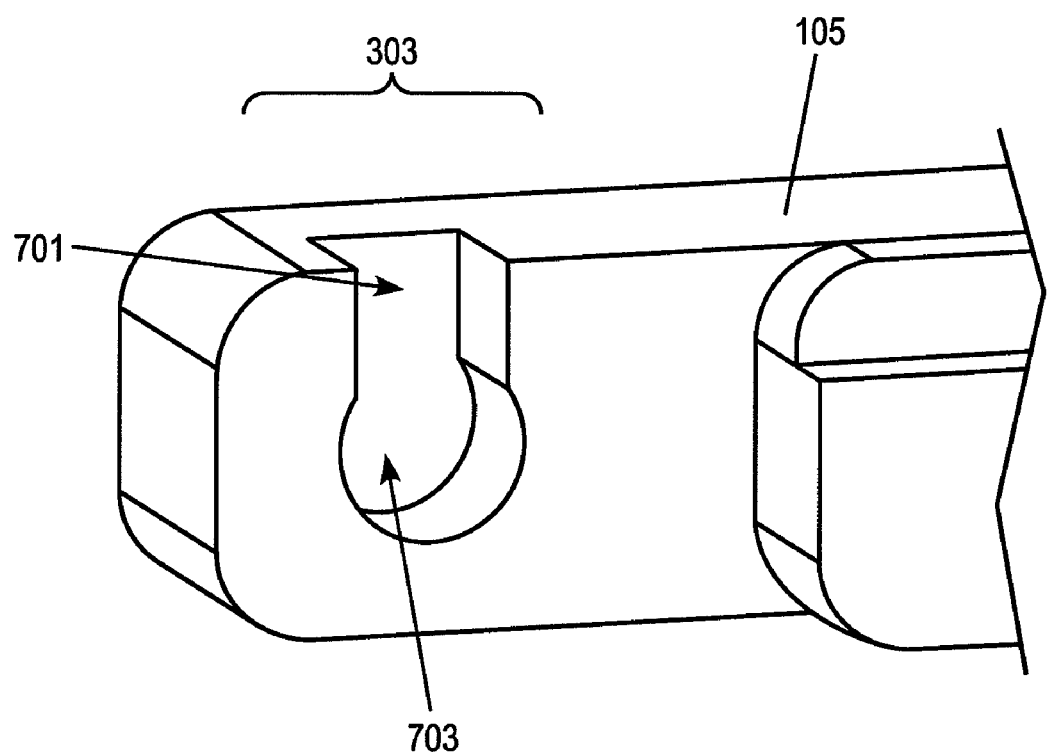
FIG. 7 is a schematic illustration of the substrate support system according to one embodiment of the present invention illustrating the details of the capture slot.

The details of slot 303 are illustrated in FIG. 7. Slot 303 comprises a narrow entrance 701 and a wider lower portion 703. The width of slot entrance 701 is slightly larger than the width of the minor axis of elliptical pin 209 but less than the width of the major axis of elliptical pin 209. When sub-component 103 is rotated to be co-planar with sub-component 105, pin 209 is captured within slot 303. Similar engagement mechanisms are used to connect neighboring links by the interaction of pins 209 and slots 309.

In some embodiments of the present invention, the substrates are held between parallel "chains" that form the substrate support system. The chains are comprised of fundamental building blocks (i.e. links) that are assembled to create chains of the desired length.

Figure 8A:
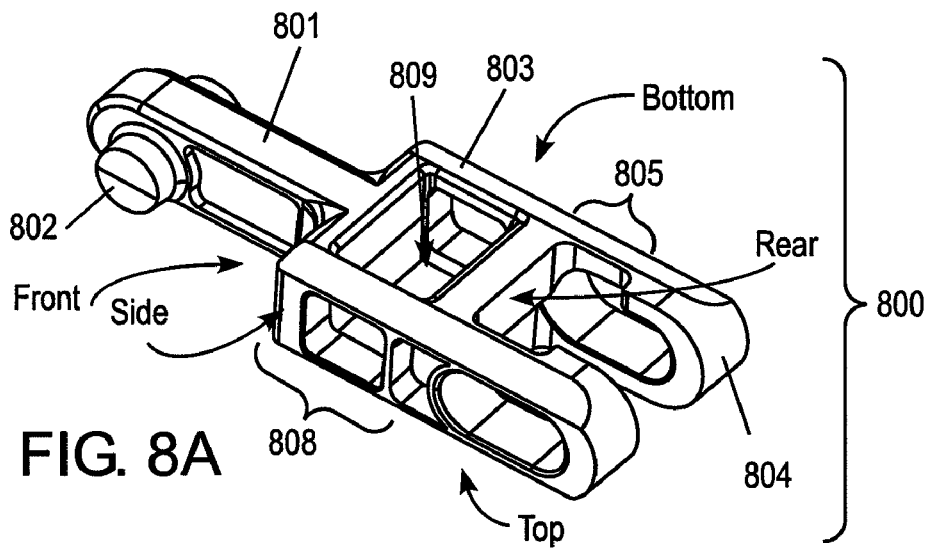
FIGS. 8A-8C are schematic illustrations of the substrate support system according to one embodiment of the present invention illustrating the fundamental building blocks.
Figure 8B:
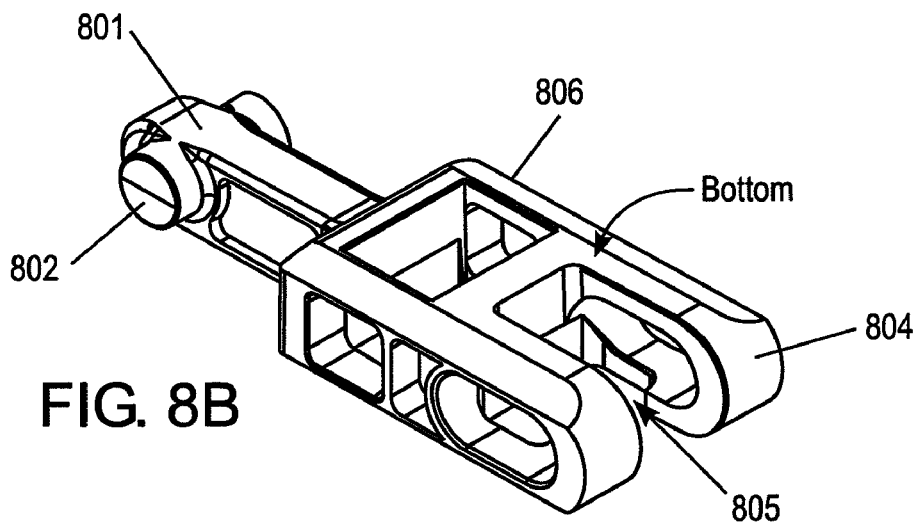
Figure 8C:
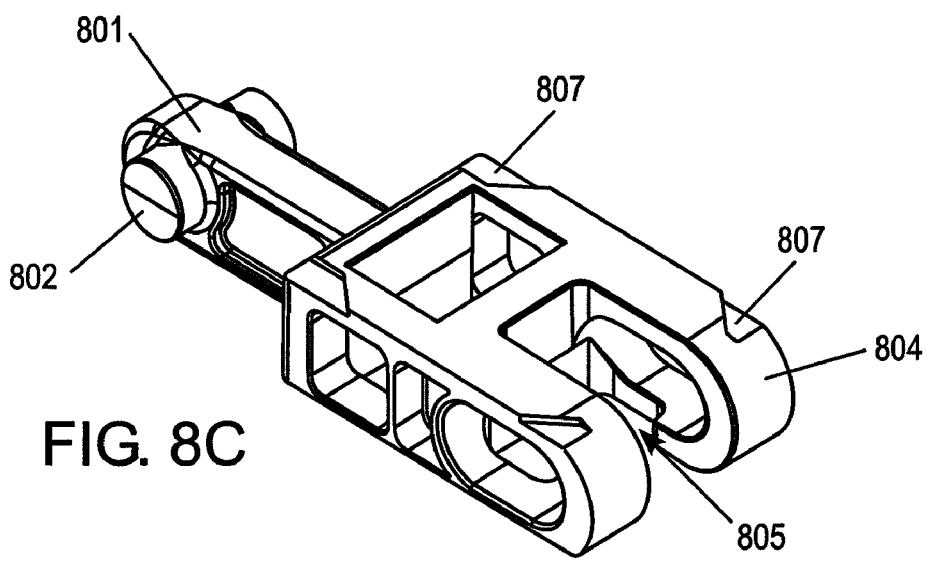

FIGS. 8A-8C are schematic illustrations of one of the links 800 that combine to form the chains. Link 800 comprises a central cavity 808. Central cavity 808 is generally formed in the shape of a rectangular box having sides denoted "top", "bottom", "front", "rear" and "side" (there are 2 "sides"). FIG. 8A illustrates link 800 as viewed from the bottom, that is, the surface of the link opposite from the substrate. Central cavity 808 comprises openings 809 that engage with teeth on a drive sprocket (not shown) to advance and align the chain. Stub 801 projects from the center of the front face of central cavity 808. Stub 801 further comprises two posts 802 at the distal end of stub 801 that project outward on opposite sides of stub 801. Posts 802 project from stub 801 in a direction aligned with the sides of central cavity 808. Capture slots 804 (there are two of them) project from the rear face of central cavity 808. Capture slots 804 have an elliptical shape wherein the major axis is aligned with the direction of travel of the chain and the minor axis is aligned parallel to the two sides of the central cavity. Capture slots 804 are aligned toward the side edges of central cavity 808 and are separated by a distance large enough to allow stub 801 to pass between them. Capture slots 804 further comprise insertion slots 805 on their surface which is aligned with the bottom surface of central cavity 808. Insertion slots 805 are sized so as to allow posts 802 to engage capture slots 804. Central cavity 808 and capture slots 804 further comprise support guides 803 on the bottom surface. Support guides 803 serve to align the chain to support rods (not shown).

FIG. 8B illustrates link 800 as viewed from the top, that is, the surface of the link supporting the substrate. Central cavity 808 and capture slots 804 further comprise substrate support surfaces 806. Substrate support surfaces 806 may be beveled, curved, angled, or contain small bumps to minimize the contact to the substrate. Typically, support surfaces 806 contact the substrate at the substrate edge. FIG. 8B illustrates one embodiment of the present invention wherein link 800 comprises a consistent support surface 806 along its length. Chains made of this style of link would require only one type of length. Substrates could be loaded at any position along the length of the chain. Chains made of this style of link would not prevent the substrates from changing their position along the length of travel while being carried through the in-line system. However, chains made of this style of link would prevent the substrates from changing their position perpendicular to the length of travel (i.e. side-to-side) while being carried through the in-line system.

FIG. 8C illustrates link 800 as viewed from the top, that is, the surface of the link supporting the substrate. Central cavity 808 and capture slots 804 further comprise substrate support surfaces 807. Substrate support surfaces 807 may be beveled, curved, angled, or contain small bumps to minimize the contact to the substrate. Typically, substrate support surfaces 807 contact the substrate at the substrate edge. The substrate support surfaces 807 as shown in FIG. 8C serves to capture the leading or trailing edge of the substrate (not shown). Chains made of this style of link would prevent the substrates from changing their position along the length of travel while being carried through the in-line system as well as prevent the substrates from changing their position perpendicular to the length of travel (i.e. side-to-side) while being carried through the in-line system. Chains using links having the substrate support surfaces 807 as illustrated in FIG. 8C would require a combination of links as illustrated in FIG. 8B and FIG. 8C. The chains would require links having substrate support surfaces 807 separated by links having support surfaces 806. The links would have to be manufactured such that they form pockets that correspond to the size of the substrates. The in-line system would have to be loaded precisely so that the substrates were properly loaded into the pockets.

Figure 9A:
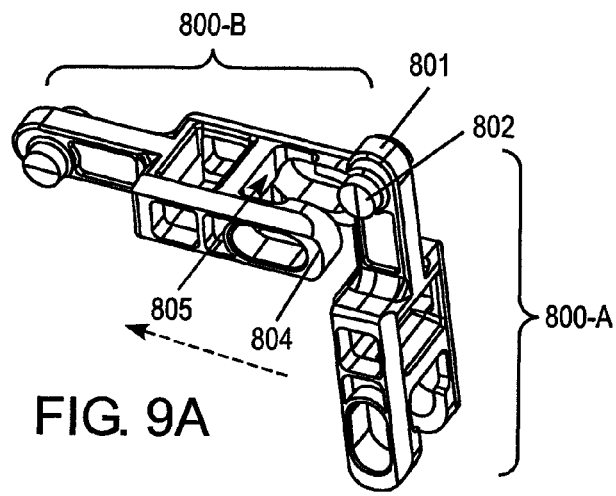
FIGS. 9A-9D are schematic illustrations of the substrate support system according to one embodiment of the present invention illustrating one method of assembly.
Figures 9B, 9C:
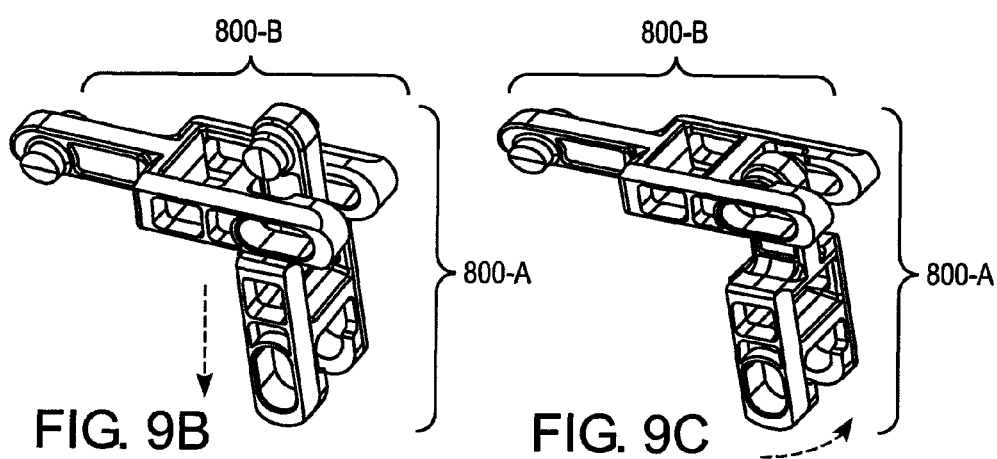

FIGS. 9A-9D illustrate the method of assembling links 800-A and 800-B to form part of a chain. The links are viewed from the bottom surface as described earlier. Link 800-B is positioned such that stub 801 is aligned perpendicular to the bottom surface of central cavity 808. Stub 801 of link 800-B is moved in the direction of the arrow and travels between the two capture slots 804 of link 800-A. The resulting configuration after this sequence of moves is illustrated in FIG. 9B.

Link 800-B is then moved in a direction toward the top surface of link 800-A as illustrated in the arrow in FIG. 9B. This movement causes posts 802 of link 800-B to engage with the insertion slots 805 of link 800-A. The resulting configuration after this sequence of moves is illustrated in FIG. 9C.

Figure 9D:
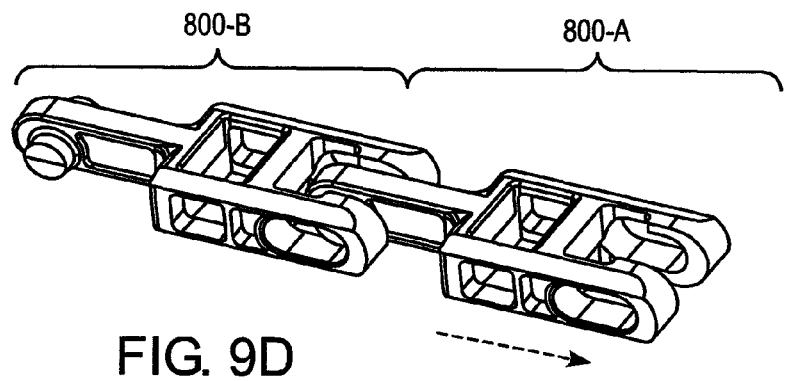

Link 800-B is then rotated in an arc toward the rear of link 800-A as illustrated in the arrow in FIG. 9B. This movement causes posts 802 of link 800-B to further engage with the insertion slots 805 of link 800-A and become captured by the two capture slots 804 of link 800-A. The resulting configuration after this sequence of moves is illustrated in FIG. 9D. Links 800-A and 800-B are now firmly attached and coplanar. This sequence may be repeated to build a chain of the desired length.

Figure 10A:
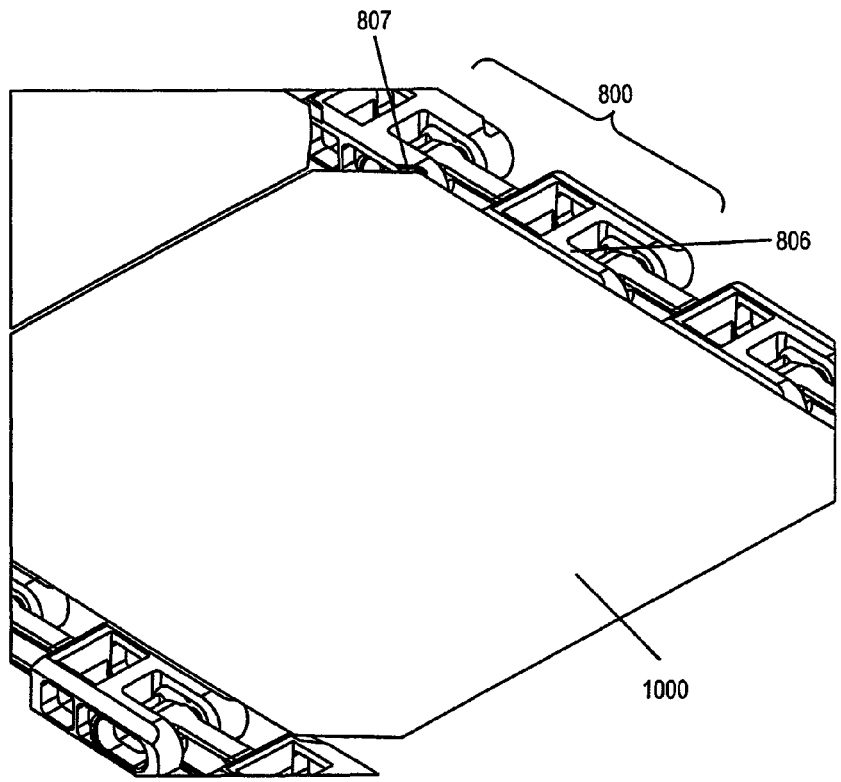
FIGS. 10A-10B are schematic illustrations of the substrate support system according to one embodiment of the present invention illustrating the support of the substrate.
Figure 10B:
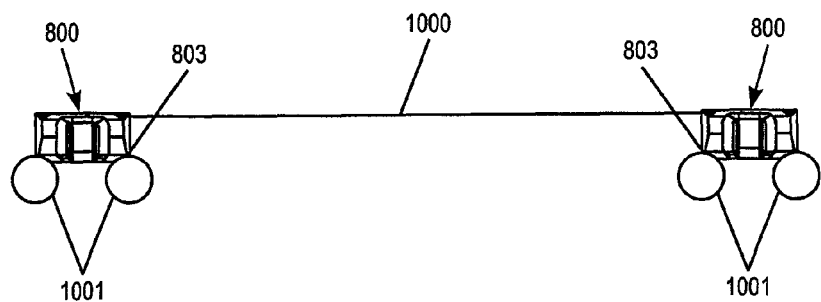

FIGS. 10A-10B illustrate the use of two parallel chains assembled from multiple links 800 to support a substrate 1000. FIG. 10A illustrates the use of two different style links. The link 800 that captures the leading or trailing edge of the substrate comprises substrate support surfaces 807. The link 800 that captures the middle of the substrate comprises substrate support surfaces 806. FIG. 10B illustrates the substrate support mechanism viewed in cross section along the length of travel. Substrate 1000 is supported on links 800 on their top surfaces. Links 800 are supported and guided by support guides 803 traveling along support rods 1001. Using this support system, the bottom surface of the substrate is advantageously exposed allowing the substrate to be processed in a uniform manner or allowing the substrate to be processed on the top and bottom surfaces simultaneously.

Links 800 may be composed of materials that do not contaminate the substrate during processing. In some process sequences, the substrate may be protected by previously deposited materials and may undergo a simple thermal treatment. In this case, the links 800 may be composed of metals or metal alloys. Typical metal materials may comprise nichrome doped with vanadium, steel alloys, and high temperature refractory metal alloys among others. In some process sequences, the substrate may not be protected by previously deposited materials or may be undergoing processing with a reactive species. In this case, it is important that the material used to form links 800 not contaminate the substrate. Various ceramic materials such as AlN, BN, SiC, $Al_2O_3$, $ZrO_2$, and others are typical examples. These ceramics have high temperature stability and are relatively inert to much reactive chemistry.

Links 800 may be formed by any well known manufacturing method. Typical examples include machining, stamping from metal sheet stock and bending, and casting, among others. Links 800 are advantageously formed by a low cost manufacturing method such as casting.

Although various embodiments which incorporate the teachings of the present invention have been shown and described in detail herein, those skilled in the art can readily devise many other varied embodiments that still incorporate these teachings.

What is claimed is:

1. An apparatus for the support of substrates comprising:
   chains comprising a plurality of links;
   the links comprising a central cavity;
   the central cavity having an inner front surface an inner rear surface, and two side surfaces;
   the links further comprising a top surface opposing a bottom surface, a plurality of side surfaces joining the top surface to the bottom surface, and a stub projecting from a front one of the side surfaces;
   the stub further comprising two posts projecting outward from opposing side surfaces at a distal end of the stub; and
   the links further comprising two capture slots projecting from the rear surface of the central cavity, each capture slot including a top surface that is a continuation of the top surface of the link and an opposing bottom surface, opposing inner and outer surfaces, and an opening from the inner surface to the outer surface to receive one of the two posts,
   wherein the opening of the capture slot has an elliptical shape with a major axis having a different length than a minor axis, wherein the major axis is aligned parallel to the top surface of the link and the minor axis is aligned perpendicular to the top surface of the link,
   wherein a portion of the inner surfaces that are positioned toward the top surface of the two capture slots are separated by a distance greater than a width of the stub and less than a total projection length of the two posts,
   wherein at least a portion of the inner surfaces that are positioned toward the bottom surface of the two capture slots are separated by a distance greater than the total projection length of the two posts to form an insertion slot on each of the capture slots, the insertion slot opening toward the bottom surface of the capture slots, and
   wherein the central cavity and the two capture slots further comprise substrate support guides on their top surfaces.

2. The apparatus of claim 1 wherein the substrate support guides capture a leading or trailing edge of a substrate.

3. The apparatus of claim 1 wherein the links are a single configuration.

4. The apparatus of claim 1 wherein the links are a mixture of different configurations.

5. The apparatus of claim 1 wherein the central cavity and the two capture slots further comprise support guides on their bottom surfaces.

6. The apparatus of claim 1 wherein the substrate support guides on a first link capture a leading or trailing edge of a substrate and the substrate support guides on a second link supports an edge of the substrate.

7. The apparatus of claim 6 wherein the substrate support guides on the second link that support the edge of the substrate are beveled, curved, angled or contain small bumps.

8. The apparatus of claim 7, wherein the chain includes a plurality of first links, each first link separated by at least one second link.

9. The apparatus of claim 7, wherein the chain includes a plurality of first links, each first link separated by at least one second link.

10. The apparatus of claim 1 wherein the substrate support guides on a first link include a means to capture a leading or trailing edge of a substrate and the substrate support guides on a second link include a means to supports an edge of the substrate.

11. A method of assembling a chain from links comprising a first and a second link, each link comprising a central cavity, a top surface opposing a bottom surface, a plurality of side surfaces joining the top surface to the bottom surface, a stub with two posts projecting outward from opposing side surfaces at a distal end of the stub, and two capture slots projecting from the rear surface of the central cavity, each capture slot including a top surface that is a continuation of the top surface of the link and an opposing bottom surface, opposing inner and outer surfaces, and an insertion slot on the bottom surface, the method comprising:
- positioning the second link substantially perpendicular to the first link so that the stub of the second link is aligned with the space separating the two capture slots of the first link and the stub of the second link being aligned in a direction toward the top surface of the first link;
- moving the second link toward the front surface of the first link so that the stub of the second link is positioned between the two capture slots of the first link;
- moving the second link in a direction toward the top surface of the first link so that the two posts on the stub of the second link engage with the insertion slots on the two capture slots of the first link; and
- rotating the second link in an arc toward the rear of the first link so that the links become coplanar,
- wherein the opening of the capture slot has an elliptical shape with a major axis having a different length than a minor axis, wherein the major axis is aligned parallel to the top surface of the link and the minor axis is aligned perpendicular to the top surface of the link,
- wherein a portion of the inner surfaces that are positioned toward the top surface of the two capture slots are separated by a distance greater than a width of the stub and less than a total projection length of the two posts,
- wherein at least a portion of the inner surfaces that are positioned toward the bottom surface of the two capture slots are separated by a distance greater than the total projection length of the two posts to form an insertion slot on each of the capture slots, the insertion slot opening toward the bottom surface of the capture slots, and
- wherein the central cavity and the two capture slots further comprise substrate support guides on their top surfaces.

\* \* \* \* \*